(12) United States Patent
Long et al.

(10) Patent No.: US 11,901,354 B2
(45) Date of Patent: Feb. 13, 2024

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Chunping Long, Beijing (CN); Hui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/255,978

(22) PCT Filed: Jun. 3, 2020

(86) PCT No.: PCT/CN2020/094123
§ 371 (c)(1),
(2) Date: Dec. 23, 2020

(87) PCT Pub. No.: WO2020/248880
PCT Pub. Date: Dec. 17, 2020

(65) Prior Publication Data
US 2021/0175223 A1    Jun. 10, 2021

(30) Foreign Application Priority Data

Jun. 12, 2019 (CN) .......................... 201920879076.4

(51) Int. Cl.
*H01L 27/12* (2006.01)
*H01L 27/02* (2006.01)

(52) U.S. Cl.
CPC ........ *H01L 27/0251* (2013.01); *H01L 27/124* (2013.01); *H01L 27/1255* (2013.01); *H01L 27/1259* (2013.01)

(58) Field of Classification Search
CPC ............... H01L 27/0251; H01L 27/124; H01L 27/1255; H01L 27/1259
(Continued)

(56) References Cited

U.S. PATENT DOCUMENTS

| 6,515,644 B1 * | 2/2003 | Kim | ................. G02F 1/136204 |
| | | | 345/87 |
| 10,685,600 B2 * | 6/2020 | Matsueda | ............. H01L 27/124 |
| 2002/0057392 A1 * | 5/2002 | Ha | ..................... G02F 1/136204 |
| | | | 349/40 |

FOREIGN PATENT DOCUMENTS

| CN | 103928459 A | 7/2014 |
| CN | 108878416 A | 11/2018 |
| CN | 209691755 U | 11/2019 |

* cited by examiner

*Primary Examiner* — Ori Nadav
(74) *Attorney, Agent, or Firm* — HOUTTEMAN LAW LLC

(57) ABSTRACT

The disclosure provides an array substrate, a manufacturing method thereof and a display device. The array substrate includes a plurality of conductive lines and an electrostatic protection circuit on a base substrate. At least some of the conductive lines are connected through the electrostatic protection circuit. Two conductive lines connected with the electrostatic protection circuit are respectively a first conductive line and a second conductive line. The electrostatic protection circuit includes a first transistor, a second transistor, and a first capacitor. A first electrode of the first transistor, a first electrode of the second transistor and a gate electrode of the second transistor are connected to the second conductive line, and a second electrode of the first transistor, a second electrode of the second transistor and a gate electrode of the first transistor are connected to the first conductive line.

15 Claims, 7 Drawing Sheets

(58) Field of Classification Search
USPC .......................................................... 257/355
See application file for complete search history.

ARRAY SUBSTRATE, MANUFACTURING METHOD THEREOF AND DISPLAY DEVICE

CROSS-REFERENCE TO RELATED APPLICATIONS

This application is a National Phase Application filed under 35 U.S.C. 371 as a national stage of PCT/CN2020/094123, files on Jun. 3, 2020, an application claiming the priority to Chinese Patent Application No. 201920879076.4, filed on Jun. 12, 2019, the contents of which are incorporated herein by reference in its entirety.

TECHNICAL FIELD

The present disclosure relates to the field of display technologies, and in particular, to an array substrate, a manufacturing method thereof and a display device.

BACKGROUND

In the structural design of a Thin Film Transistor Liquid Crystal Display (TFT-LCD), in order to prevent devices on an array substrate from being damaged by sudden increase of a voltage on a conductive line of the array substrate due to abnormality, an electrostatic protection circuit is generally provided at the periphery of the array substrate to ensure the display performance of the liquid crystal display.

SUMMARY

As an aspect, an array substrate is provided. The array substrate includes a plurality of conductive lines and an electrostatic protection circuit on a base substrate. At least some of the plurality of conductive lines are connected through the electrostatic protection circuit, and two conductive lines connected to the electrostatic protection circuit are a first conductive line and a second conductive line respectively. The electrostatic protection circuit comprises a first transistor, a second transistor, and a first capacitor. A first electrode of the first transistor, a first electrode of the second transistor and a gate electrode of the second transistor are connected to the second conductive line, and a second electrode of the first transistor, a second electrode of the second transistor and a gate electrode of the first transistor are connected to the first conductive line. The first capacitor is connected between the gate electrode of the first transistor and the second conductive line.

In an embodiment, the gate electrode of the first transistor is on a side of the base substrate. The gate insulating layer is on a side of the gate electrode of the first transistor away from the base substrate. An active layer of the first transistor is on a side of the gate insulating layer away from the base substrate. A first extension portion of the second conductive line is on a side of the active layer of the first transistor away from the base substrate such that the first extension portion of the second conductive line and a portion of the gate electrode of the first transistor constitute the first capacitor, the first extension portion of the first conductive line serving as a first electrode plate of the first capacitor, and the portion of the gate electrode of the first transistor serving as a second electrode plate of the first capacitor.

In an embodiment, the electrostatic protection circuit further includes a second capacitor connected between the gate electrode of the second transistor and the first conductive line.

In an embodiment, the gate electrode of the second transistor is on the side of the base substrate. The gate insulating layer is on a side of the gate electrode of the second transistor away from the base substrate. A second extension portion of the first conductive line is on the side of the gate insulating layer away from the base substrate such that the second extension portion of the first conductive line and a portion of the gate electrode of the second transistor constitute the second capacitor, the second extension portion of the first conductive line serving as a first electrode plate of the second capacitor, and the portion of the gate electrode of the second transistor serving as a second electrode plate of the second capacitor.

In an embodiment, a third extension portion of the first conductive line serves as a second electrode of the first transistor, a fourth extension portion of the first conductive line serves as the second electrode of the second transistor, a fifth extension portion of the second conductive line serves as the first electrode of the first transistor, and a sixth extension portion of the second conductive line serves as the first electrode of the second transistor.

In an embodiment, the first electrode of the first transistor of the electrostatic protection circuit includes a plurality of first interdigital portions spaced apart from each other and electrically connected together at one ends. The second electrode of the first transistor includes a plurality of second interdigital portions spaced apart from each other and electrically connected together at one ends. Each of the first interdigital portions is between two adjacent second interdigital portions of the plurality of second interdigital portions, and each of the second interdigital portions is between two adjacent first interdigital portions of the plurality of first interdigital portions.

In an embodiment, the first electrode of the second transistor of the electrostatic protection unit includes a plurality of third interdigital portions spaced apart from each other and electrically connected together at one ends. The second electrode of the second transistor includes a plurality of fourth interdigital portions spaced apart from each other and electrically connected together at one ends. Each of the third interdigital portions is between two adjacent fourth interdigital portions of the plurality of fourth interdigital portions, and each of the fourth interdigital portions is between two adjacent third interdigital portions of the plurality of third interdigital portions.

In an embodiment, the array substrate includes a plurality of electrostatic protection circuits. The first conductive line electrically connected to each of plurality of the electrostatic protection circuits is a first data line. The second conductive line electrically connected to each of the electrostatic protection circuits is a branch of a second data line, the second data line being immediately adjacent to the first data line. One of the plurality of electrostatic protection circuits is connected between any two adjacent data lines.

In an embodiment, two electrostatic protection circuits adjacent to any one data line are symmetrically arranged on both sides of the data line with the data line as a symmetry axis. Two second conductive lines branched from any one data line are symmetrically arranged on both sides of the data line with the data line as a symmetry axis.

In an embodiment, the array substrate includes a plurality of electrostatic protection circuits. The plurality of conductive lines further includes a discharge line. The first conductive line electrically connected to each of the plurality of electrostatic protection circuits is a data line, and each data line is connected to the discharge line through the electrostatic protection circuit.

In an embodiment, the second conductive line is between two adjacent data lines. Gate electrodes of the second transistors and extension portions of the gate electrodes extend along one line to jointly constitute the discharge line. The second extension portion of each data line extends on the discharge line such that the second extension portion of each data line and a portion of the discharge line constitute the second capacitor of the electrostatic protection circuit, the second extension portion of each data line serving as a first electrode plate of the second capacitor, and the portion of the discharge line serving as a second electrode plate of the second capacitor.

In an embodiment, the array substrate includes a plurality of electrostatic protection circuits. The plurality of conductive lines further includes a discharge line and a short-circuit bar. The first conductive line electrically connected to each of the plurality of electrostatic protection circuits is a data line or the discharge line. Each data line and the discharge line are respectively connected to the short-circuit bar through the electrostatic protection circuit.

In an embodiment, one of a plurality of second conductive lines is between the discharge line and a data line adjacent to the discharge line. Each of remaining second conductive lines of the plurality of second conductive lines is between any two adjacent data lines. Gate electrodes of the second transistors and extension portions of the gate electrodes extend along one line to jointly constitute the short-circuit bar. The second extension portion of the data line or discharge line extends on the short-circuit bar such that the second extension portion of the data line or discharge line and a portion of the short-circuit bar form the second capacitor, the second extension portion of the data line or discharge line serving as a first electrode plate of the second capacitor, and the portion of the short-circuit bar serving as a second electrode plate of the second capacitor.

In an embodiment, the discharge line is a common electrode line.

As an aspect, a display device including above array substrate is provided.

As an aspect, a method for manufacturing an array substrate is provided. The array substrate includes a plurality of conductive lines and an electrostatic protection circuit. The electrostatic protection circuit includes a first transistor, a second transistor, and a first capacitor. The method includes forming the first transistor and the second transistor such that a first electrode of the first transistor, a first electrode of the second transistor, and a gate electrode of the second transistor are connected to a second conductive line of the plurality of conductive lines, and a second electrode of the first transistor, a second electrode of the second transistor, and a gate electrode of the first transistor are connected to a first conductive line of the plurality of conductive lines, and forming the first capacitor such that the first capacitor is connected between the gate electrode of the first transistor and the second conductive line.

In an embodiment, forming the first capacitor such that the first capacitor is connected between the gate electrode of the first transistor and the second conductive line includes forming the second conductive line such that a first extension portion of the second conductive line extends on the gate electrode of the first transistor to form the first capacitor by the first extension portion of the second conductive line and a portion of the gate electrode of the first transistor, the first extension portion of the second conductive line serving as a first electrode plate of the first capacitor, and the portion of the gate electrode of the first transistor serving as a second electrode plate of the first capacitor.

In an embodiment, the method further includes forming a second capacitor of the electrostatic protection circuit such that the second capacitor is connected between the gate electrode of the second transistor and the first conductive line.

In an embodiment, forming the second capacitor such that the second capacitor is connected between the gate electrode of the second transistor and the first conductive line includes forming the first conductive line such that a second extension portion of the first conductive line extends on the gate electrode of the second transistor to form the second capacitor by the second extension portion of the first conductive line and a portion of the gate electrode of the second transistor, the second extension portion of the first conductive line serving as a first electrode plate of the second capacitor, and the portion of the gate electrode of the second transistor serving as a second electrode plate of the second capacitor.

BRIEF DESCRIPTION OF THE DRAWINGS

FIG. 1b is a top view of a structure of the array substrate shown in FIG. 1a;

FIG. 2b is a top view of the array substrate shown in FIG. 2a;

FIG. 3b is a top view of a structure of the array substrate shown in FIG. 3a;

FIG. 4b is a top view of a structure of the array substrate shown in FIG. 4a.

DETAILED DESCRIPTION

To enable one of ordinary skill in the art to better understand the technical solutions of the present disclosure, the present disclosure will be further described in detail below with reference to exemplary embodiments and the accompanying drawings.

An electrostatic protection circuit in the related art includes an electrostatic protection line and at least one transistor. Gate and drain electrodes of the transistor are connected to a signal line of the liquid crystal display, and a source electrode thereof is connected to the electrostatic protection line. When an electrostatic voltage on the signal line is overlarge, the transistor is turned on, and the voltage on the signal line is released to the electrostatic protection line, thereby ensuring the performance of the liquid crystal display.

However, when an instantaneously large voltage is generated on the signal line, an excessive voltage difference across the source and drain electrodes of the transistor probably results in the damage to the transistor and the failure of the electrostatic protection circuit.

In the present disclosure, two structures are "formed in the same layer" means that the two structures are formed from the same material layer, and thus are in the same layer in a stacked relationship, but neither means that the two structures are equidistant from the base substrate, nor that other layer structures between the base substrate and the two structures are completely identical to each other. In the present disclosure, "unitary structure" or "one-piece structure" means that various components forming the "unitary structure" or "one-piece structure" are formed as one piece or as a single piece from the same material. Alternatively, the various components of the "unitary structure" or "one-piece structure" are in the same layer in a stacked relationship.

In addition, each of the transistors used in the electrostatic protection circuit of the array substrate of the present disclosure may be a thin film transistor. A source electrode of each of the transistors is symmetrical to a drain electrode of the transistor, therefore the source and drain electrodes can be interchanged. In an embodiment of the present disclosure, a source electrode may be referred to as a first electrode, and a drain electrode may be referred to as a second electrode; alternatively, a drain electrode may be referred to as a first electrode, and a source electrode may be referred to as a second electrode. Embodiments in which a drain electrode of a first transistor is referred as a first electrode and a source electrode of the first transistor is referred as a second electrode, and a source electrode of a second transistor is referred as a first electrode and a drain electrode of the second transistor is referred as a second electrode will be described below.

Figure 1A:
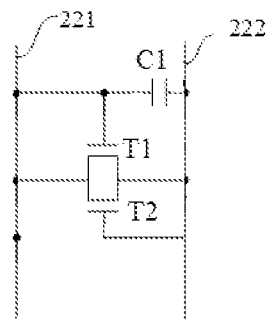
FIG. 1a is a circuit diagram of an array substrate according to an embodiment of the present disclosure.
Figure 1B:
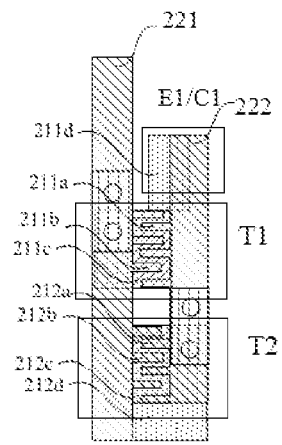

FIG. 1a is a circuit diagram of an array substrate according to an embodiment of the present disclosure. FIG. 1b is a top view of a structure of the array substrate shown in FIG. 1a. As shown in FIGS. 1a and 1b, an array substrate includes a plurality of conductive lines and an electrostatic protection circuit. At least two of the conductive lines are connected to each other through the electrostatic protection circuit. Two conductive lines, i.e., a first conductive line 221 and a second conductive line 222, are connected to the electrostatic protection circuit respectively.

The electrostatic protection circuit includes a first transistor T1, a second transistor T2, and a first capacitor C1.

A first electrode of the first transistor T1, a first electrode of the second transistor T2, and a gate electrode of the second transistor T2 are connected to the second conductive line 222. A second electrode of the first transistor T1, a second electrode of the second transistor T2, and a gate electrode of the first transistor T1 are connected to the first conductive line 221.

The first capacitor C1 is connected between the gate electrode of the first transistor T1 and the second conductive line 222.

In an embodiment, the array substrate may include a plurality of electrostatic protection circuits each having two transistors that are oppositely arranged and connected in parallel. The two conductive lines, i.e., the first conductive line 221 and the second conductive line 222, are connected to each of the electrostatic protection circuits respectively.

The electrostatic protection process of the electrostatic protection circuit will be described below. For an electrostatic protection circuit, in a case where the second conductive line 222 connected to the electrostatic protection circuit serves as an electrostatic protection line, since the electrostatic protection line is generally grounded, a voltage of the electrostatic protection line may be 0V. When the voltage of the first conductive line 221 changes significantly and suddenly, the first transistor T1 or the second transistor T2 is turned on, and the voltage of the first conductive line 221 is released to the second conductive line 222 through the first transistor T1 or the second transistor T2, realizing the electrostatic protection of the electrostatic protection circuit for the first conductive line 221.

For example, in the electrostatic protection circuit shown in FIG. 1a, when a large voltage is instantaneously generated in the signal line (e.g., when the voltage of the first conductive line 221 suddenly increases), due to the coupling effect of the first capacitor C1 between the gate electrode of the first transistor T1 and the second conductive line 222, the voltage at the first electrode of the first transistor T1 may be increased accordingly (but the voltage of the first electrode of the first transistor T1 does not reach the increased voltage of the second conductive line 222), so that a voltage difference across the first electrode and the second electrode of the first transistor T1 is decreased, preventing the first transistor T1 from being damaged by the relatively large voltage difference across the first electrode and the second electrode of the first transistor T1, and thus prolonging the lifetime of the electrostatic protection circuit.

For example, if the first conductive line 221 has an operating voltage of 5V, the first electrode of the first transistor T1 has a voltage of 4V under the function of coupling effect of the first capacitor C1, and a voltage difference (i.e., 1V) across the gate electrode and the first electrode of the first transistor T1 is smaller than a threshold voltage (5V) of the first transistor T1, so that the first transistor T1 is not turned on.

When the voltage of the first conductive line 221 suddenly increases to 20V, the first electrode of the first transistor T1 has a voltage of 10V under the function of coupling effect of the first capacitor C1, and each of the voltage at the second electrode and the voltage at the gate electrode of the first transistor T1 is 20V; at this time, a voltage difference between the voltage at the gate electrode of the first transistor T1 and the voltage at the first electrode of the first transistor T1 is 10V and is greater than the threshold voltage (i.e., 5V) of the first transistor T1, so that the first transistor T1 is turned on, thereby realizing electrostatic protection. Further, a voltage difference between the voltage at the first electrode of the first transistor T1 and the voltage at the second electrode of the first transistor T1 is 10V and is much less that the voltage difference (i.e., 20V) between the voltage at the first electrode and the voltage at the second electrode in a case where the first capacitor C1 is not provided, thereby preventing the first transistor T1 from being damaged due to an excessively large voltage difference between the voltage at the first electrode and the voltage at the second electrode of the first transistor T1.

For another example, the operating voltage of the first conductive line 221 suddenly decreases to −20V, each of the gate electrode and the first electrode of the second transistor T2 has a voltage of −10V under the function of the coupling effect of the first capacitor C1, and the voltage at the second electrode of the second transistor T2 is −20V; at this time, the voltage difference across the gate electrode and the second electrode of the second transistor T2 is 10V and is greater than the threshold voltage (5V) of the second transistor T2, so that the second transistor T2 is turned on, thereby implementing electrostatic protection. At this time, the voltage difference between the voltage at the first electrode and the voltage at the second electrode of the second transistor T2 is 10V and is much less than the voltage difference (i.e., 20V) between the voltage at the first electrode and the voltage at the second electrode of the second transistor T2 in a case where the first capacitor C1 is not provided, thereby preventing the second transistor T2 from being damaged due to an excessive voltage difference across the first electrode and the second electrode of the second transistor T2.

FIG. 1b is a top view of a structure of the array substrate shown in FIG. 1a. FIG. 1b shows, in the blocks, structures of the first transistor T1 and the second transistor T2 respectively corresponding to the first transistor T1 and second transistor T2 shown in FIG. 1a, and shows, in the block, a structure of a first capacitor C1 corresponding to the first capacitor C1 in FIG. 1a.

Figure 1C:
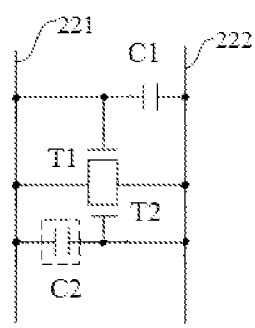
FIG. 1c is a circuit diagram of an array substrate according to an embodiment of the present disclosure.

FIG. 1c is a circuit diagram of an array substrate according to an embodiment of the present disclosure. As shown in FIG. 1c, the circuit diagram of the array substrate shown in FIG. 1c is substantially the same as the circuit diagram of the array substrate shown in FIG. 1a except that the electrostatic protection circuit further includes a second capacitor C2. The second capacitor C2 is connected between the gate electrode of the second transistor T2 and the first conductive line 221.

The electrostatic protection circuit includes two transistors T1, T2 and two capacitors C1, C2. The operation process of the electrostatic protection circuit including the two capacitors C1, C2 is similar to the operation process of above electrostatic protection circuit, and detailed description will not be repeated herein.

Since two capacitors have a greater coupling effect than one capacitor, the voltage difference across the first electrode and the second electrode of the first transistor T1 and the voltage difference across the first electrode and the second electrode of the second transistor T2 can be further decreased, thereby realizing the protection of the first transistor T1 and the second transistor T2 to a greater extent, and in turn ensuring the performance of the electrostatic protection circuit.

Figure 1D:
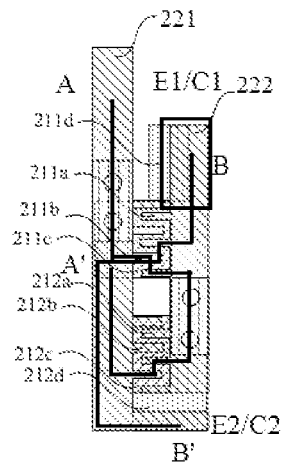
FIG. 1d is a top view of a structure of the array substrate shown in FIG. 1c.

FIG. 1d is a top view of a structure of the array substrate shown in FIG. 1c. FIG. 1d shows the structure of the second capacitor C2. The structure of the array substrate shown in FIG. 1d is substantially the same as that of the array substrate shown in FIG. 1b except that the electrostatic protection circuit further includes a second capacitor C2.

Figure 1E:
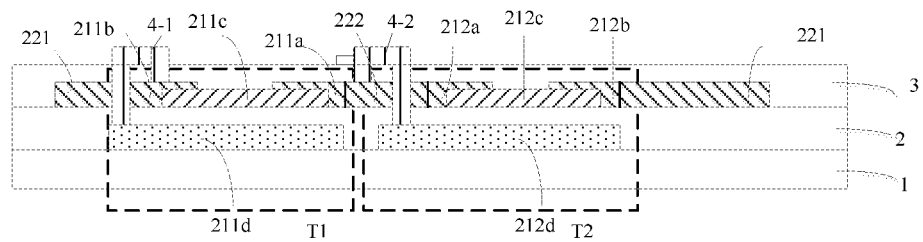
FIG. 1e is a cross-sectional view taken along line AA' of the array substrate shown in FIG. 1d.

FIG. 1e is a cross-sectional view taken along line AA' in FIG. 1d. As shown in FIGS. 1d and 1e, the electrostatic protection circuit of the array substrate in the present embodiment includes a base substrate 1, and the first transistor T1 and the second transistor T2 formed on the base substrate 1.

The first gate electrode 211d of the first transistor T1 and the second gate electrode 212d of the second transistor T2 are both located on the base substrate 1.

A gate insulating layer 2 is located on a side of the first gate electrode 211d and the second gate electrode 212d away from the base substrate 1 and covers the first gate electrode 211d and the second gate electrode 212d.

A first active layer 211c of the first transistor T1 is located on a side of the gate insulating layer 2 away from the base substrate 1. An orthographic projection of the first active layer 211c on the base substrate 1 overlaps (e.g., completely overlaps) an orthographic projection of the first gate electrode 211d on the base substrate 1.

A second active layer 212c of the second transistor T2 is located on a side of the gate insulating layer 2 away from the base substrate. An orthographic projection of the second active layer 212c on the base substrate 1 overlaps (e.g., completely overlaps) an orthographic projection of the second gate electrode 212d on the base substrate 1.

The first electrode 211a of the first transistor T1 and the first electrode 212a of the second transistor T2 are connected to the second conductive line 222 and are formed as a unitary structure or one piece structure with the second conductive line 222. As shown in FIG. 1d, an extension portion (i.e., a fifth extension portion) of the second conductive line 222 extends leftward to form the first electrode 211a of the first transistor T1, and another extension portion (i.e., a sixth extension portion) of the second conductive line 222 extends leftward to form the first electrode 212a of the second transistor T2.

The first electrode 211a of the first transistor T1 is located on a side of the first active layer 211c away from the base substrate. The second conductive line 222 is electrically connected to the second gate electrode 212d of the second transistor T2 through a via extending through the gate insulating layer 2, the second conductive line 222 and the passivation layer 3 and a via extending through the passivation layer 3.

The first electrode 212a of the second transistor T2 is located on a side of the second active layer 212c away from the base substrate and is electrically connected to the second gate electrode 212d of the second transistor T2 through a via extending through the gate insulating layer 2, the second conductive line 222 and the passivation layer 3 and a via extending through the passivation layer 3.

The second electrode 212b of the second transistor T2 is located on a side of the second active layer 212c away from the base substrate 1.

The second electrode 211b of the first transistor T1 is located on a side of the first active layer 211c away from the base substrate 1, and is electrically connected to the first gate electrode 211d of the first transistor T1 through a via extending through the gate insulating layer 2 and the passivation layer 3.

The second electrode 211b of the first transistor T1 and the second electrode 212b of the second transistor T2 are connected to the first conductive line 221, and are formed as a unitary structure or one piece structure with the first conductive line 221. As shown in FIG. 1d, an extension portion (i.e., a third extension portion) of the first conductive line 221 extends rightward to form the second electrode 211b of the first transistor T1, and another extension portion (i.e., a fourth extension portion) of the first conductive line 221 extends rightward to form the second electrode 212b of the second transistor T2.

Figure 1F:
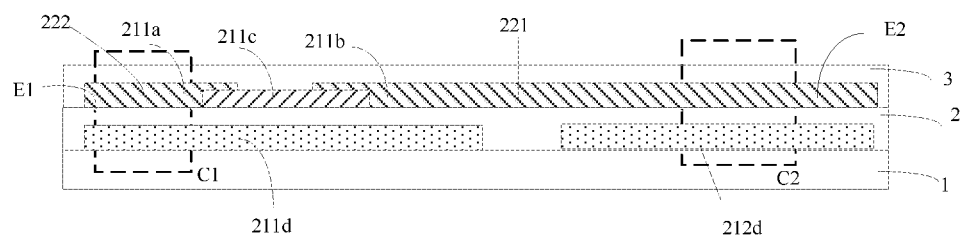
FIG. 1f is a cross-sectional view taken along line BB' of the array substrate shown in FIG. 1d.

FIG. 1f is a cross-sectional view taken along line BB' in FIG. 1d. The first electrode 211a of the first transistor T1 is located on a side of the first active layer 211c away from the base substrate 1. The second conductive line 222 and the first electrode 211a of the first transistor T1 are formed as one piece structure. An extension portion of the second conductive line 222 (i.e., a first extension portion E1) extends on the gate electrode 211d of the first transistor T1. The first extension portion E1 of the second conductive line 222 is located on a side of the first active layer 211c of the first transistor T1 away from the base substrate 1. The first extension portion E1 of the second conductive line 222 and a portion of the gate electrode 211d of the first transistor T1 form the first capacitor C1, as shown in the block. The first extension portion E1 of the second conductive line 222 serves as a first electrode plate of the first capacitor C1, and the portion of the gate electrode 211d of the first transistor T1 serves as a second electrode plate of the first capacitor C1.

The second electrode 211b of the first transistor T1 is located on a side of the active layer 211c of the first transistor T1 away from the base substrate 1. The second electrode 211b of the first transistor T1 is connected to the gate electrode 211d of the first transistor T1 through a via extending through the gate insulating layer 2, the data line 221, and the passivation layer 3, and a via extending through the passivation layer 3.

An extension portion of the first conductive line 221 (i.e., the second extension portion E2) extends from the first conductive line 221 and extends on the gate electrode 212d of the second transistor T2. The second extension portion E2 of the first conductive line 221 is located on a side of the gate insulating layer 2 away from the base substrate 1 such that the second extension portion E2 of the first conductive line 221 and a portion of the gate electrode 212d of the second transistor T2 form the second capacitor C2, as shown in the block. The second extension portion E2 of the first conductive line 221 serves as a first electrode plate of the second capacitor C2, and the portion of the gate electrode 212d of the second transistor T2 serves as a second electrode plate of the second capacitor C2.

In an embodiment, as shown in FIGS. 1b and 1d, the first electrode 211a of the first transistor includes a plurality of first interdigital portions disposed at intervals and electrically connected to each other, and the second electrode 211b of the first transistor includes a plurality of second interdigital portions disposed at intervals and electrically connected to each other. Each of at least some of the first interdigital portions is located between adjacent second interdigital portions, and each of at least some of the second interdigital portions is located between adjacent first interdigital portions. The plurality of first interdigital portions and the plurality of second interdigital portions are arranged alternately and spaced apart from each other.

In an embodiment, each of the first interdigital portions is located between two adjacent second interdigital portions, and each of the second interdigital portions is located between two adjacent first interdigital portions.

The first electrode 212a of the second transistor T2 includes a plurality of third interdigital portions arranged at intervals and electrically connected to each other, and the second electrode 212b of the second transistor T2 includes a plurality of fourth interdigital portions arranged at intervals and electrically connected to each other. Each of at least some of the third interdigital portions is located between the adjacent fourth interdigital portions, and each of at least some of the fourth interdigital portions is located between the adjacent third interdigital portions. The third interdigital portions and the fourth interdigital portions are arranged alternately and spaced apart from each other.

In an embodiment, each of the third interdigital portions is located between adjacent fourth interdigital portions, and each of the fourth interdigital portions is located between adjacent third interdigital portions.

The first electrode 211a and the second electrode 211b of the first transistor have interdigital electrode structures arranged in a cross manner and spaced apart from each other. The first electrode 212a and second electrode 212b of the second transistor T2 have interdigital electrode structures arranged to cross each other and spaced apart from each other.

The interdigital electrode structure of the first transistor T1 and the interdigital electrode structure of the second transistor T2 make the conductivity of the first electrode 211a and the second electrode 211b of the first transistor T1 more uniform, and the conductivity of the first electrode 212a and the second electrode 212b of the second transistor T2 more uniform as well, thereby avoiding the damage of the transistors to a greater extent, and further improving the performance and the service life of the electrostatic protection circuit.

As shown in FIG. 1d, the second conductive line 222, the first extension portion E1 of the second conductive line 222, the first electrode 211a of the first transistor T1, the first electrode 212a of the second transistor T2, and the first electrode plate of the first capacitor C1 are of a unitary structure. The gate electrode 211d of the first transistor T1 and the second electrode plate of the first capacitor C1 are of a one-piece structure. The second electrode 211b of the first transistor T1, the second electrode 212b of the second transistor T2, the first conductive line 221, the second extension portion E2 of the first conductive line 221, and the first electrode plate of the second capacitor C2 are of a unitary structure. The gate electrode 212d of the second transistor T2 and the second electrode plate of the second capacitor C2 are of a unitary structure.

The second conductive line 222, the first extension portion E1 of the second conductive line 222, the first electrode plate of the first capacitor C1, the first electrode 211a of the first transistor T1, and the first electrode 212a of the second transistor T2 are disposed in the same layer. The second electrode plate of the first capacitor C1 is disposed in the same layer as the gate electrode 211d of the first transistor T1. The first conductive line 221, the second extension portion E2 of the first conductive line 221, the first electrode plate of the second capacitor C2, the second electrode 211b of the first transistor T1, and the second electrode 212b of the second transistor T2 are disposed in the same layer. The second electrode plate of the second capacitor C2 is disposed in the same layer as the gate electrode 212d of the second transistor T2.

The first extension portion E1 of the second conductive line 222 serves as or forms the first electrode plate of the first capacitor C1, and a portion of the gate electrode 211d of the first transistor T1 serves as or forms the second electrode plate of the first capacitor C1. The second extension portion E2 of the first conductive line 221 serves as or forms the first electrode plate of the second capacitor C2, and a portion of the gate electrode 212d of the second transistor T2 serves as or forms the second electrode plate of the second capacitor C2.

The arrangement of the first capacitor C1 and the second capacitor C2 does not complicate the manufacturing steps of the array substrate of the embodiment, and better ensures the performance of the electrostatic protection circuit without increasing the complexity of the manufacturing steps.

In the above embodiments, the conductive line may be a data line.

Figure 2A:
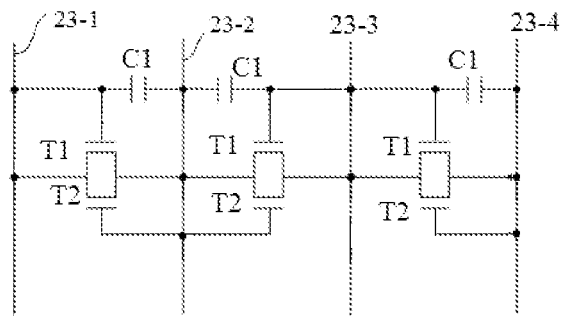
FIG. 2a is a circuit diagram of an array substrate according to an embodiment of the present disclosure.
Figure 2B:
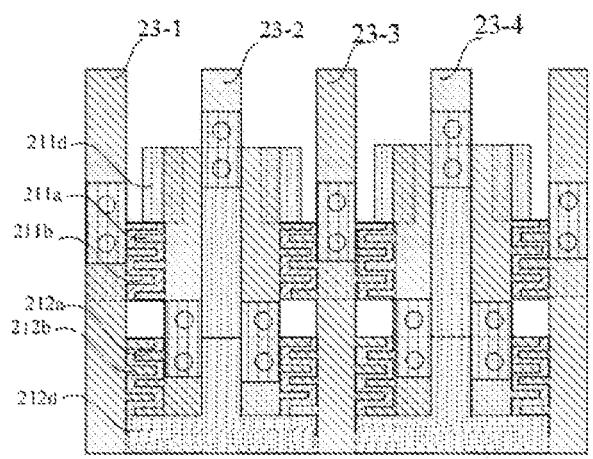

FIG. 2a is a circuit diagram of an array substrate according to an embodiment of the present disclosure; FIG. 2b is a top view of a structure of an array substrate according to an embodiment of the present disclosure. As shown in FIGS. 2a and 2b, the present embodiment provides an array substrate including a plurality of conductive lines and a plurality of electrostatic protection circuit. Each of the plurality of conductive lines is a data line. At least some of the conductive lines are connected through the electrostatic protection circuit, and the two conductive lines connected to each of the electrostatic protection circuits are a first data line 23-1 and a second data line 23-2, respectively.

As shown in FIG. 2a, each of the electrostatic protection circuits includes a first transistor T1, a second transistor T2, and a first capacitor C1.

For the electrostatic protection circuit between the first data line 23-1 and the second data line 23-2, a first electrode 211a of the first transistor T1, a gate electrode 212d of the second transistor T2, and a first electrode 212a of the second transistor T2 are connected to the second data line 23-2. A second electrode 211b of the first transistor T1, a second electrode 212b of the second transistor T2, and a gate electrode 211d of the first transistor T1 are connected to the first data line 23-1.

The first capacitor C1 is connected between the gate electrode 211d of the first transistor T1 and the second data line 23-2.

For the electrostatic protection circuit between the second data line 23-2 and the third data line 23-3, a first electrode 211a of the first transistor T1, a gate electrode 211d of the first transistor T1, and a first electrode 212a of the second transistor T2 are connected to the third data line 23-3. A second electrode 211b of the first transistor T1, a second electrode 212b of the second transistor T2, and a gate electrode 212d of the second transistor T2 are connected to the second data line 23-2.

The first capacitor C1 is connected between the gate electrode 211d of the first transistor T1 and the second data line 23-2.

The structure of the electrostatic protection circuit between the third data line 23-3 and the fourth data line 23-4 is substantially the same as the structure of the electrostatic protection circuit between the first data line 23-1 and the second data line 23-2, and therefore the detailed description thereof is omitted.

In the embodiment, two electrostatic protection circuits connected to any one data line are axisymmetrically arranged on both sides of the data line with the data line serving as an axis.

Figure 2C:
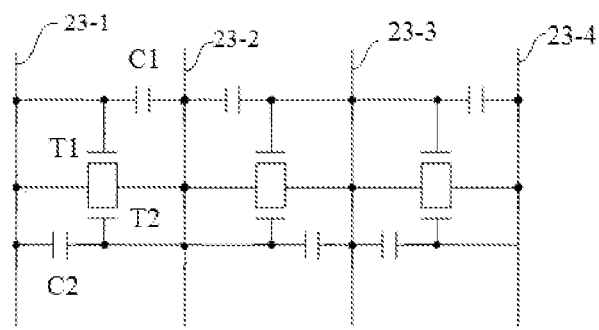
FIG. 2c is a circuit diagram of an array substrate according to an embodiment of the present disclosure.
Figure 2D:
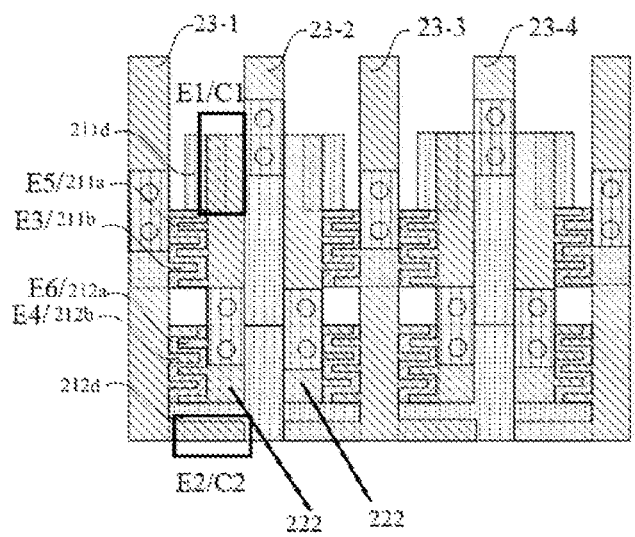
FIG. 2d is a top view of the array substrate shown in FIG. 2c.

FIG. 2c is a circuit diagram of an array substrate according to an embodiment of the present disclosure; FIG. 2d is a top view of the structure of the array substrate shown in FIG. 2c. As shown in FIG. 2c, each of the electrostatic protection circuits includes a first transistor T1, a second transistor T2, a first capacitor C1, and a second capacitor C2. The electrostatic protection circuit in the array substrate shown in FIG. 2c is substantially the same as the electrostatic protection circuit of the array substrate shown in FIG. 2a except that each of electrostatic protection circuits includes the second capacitor C2.

In the embodiments as shown in FIGS. 2a to 2d, except that all of the conductive lines 23-1, 23-2, 23-3, and 23-4 are data lines, the structures of the electrostatic protection circuits in the array substrates shown in FIGS. 2a and 2c are substantially the same as those of the electrostatic protection circuits in the array substrates shown in FIGS. 1a and 1c, respectively, and thus the detailed description thereof is omitted.

As shown in FIGS. 2c and 2d, the array substrate includes a plurality of electrostatic protection circuits and a plurality of data lines 23-1, 23-2, 23-3, 23-4, etc. The data lines are arranged in sequence according to the numbers, and the electrostatic protection circuit is connected between any two adjacent data lines.

As shown in FIG. 2d, the odd-numbered data lines 23-1 and 23-3 are not branched, and the even-numbered data lines 23-2 and 23-4 are branched into two second conductive lines 222. One electrostatic protection circuit is electrically connected between one of two adjacent second conductive lines 222 and the data line 23-1. The second conductive line 222 is located between any two adjacent data lines 23-1 and 23-2.

An extension portion (i.e., a first extension portion E1) of the second conductive line 222 extends on the gate electrode 211d of the first transistor T1 such that the first extension portion E1 of the second conductive line 222 and a portion of the gate electrode 211d of the first transistor T1 constitute the first capacitor C1, with the first extension portion E1 of the second conductive line 222 serving as a first electrode plate of the first capacitor C1 and the portion of the gate electrode 211d of the first transistor T1 serving as a second electrode plate of the first capacitor C1.

An extension portion (i.e., a second extension portion E2) of the data line 23-1 connected to the electrostatic protection circuit extends on the gate electrode 212d of the second transistor T2 such that the second extension portion E2 of the data line 23-2 and a portion of the gate electrode 212d of the second transistor T2 constitute the second capacitor C2, with the second extension portion E2 of the data line 23-2 serving as a first electrode plate of the second capacitor C2, and the portion of the gate electrode 212d of the second transistor T2 serving as a second electrode plate of the second capacitor C2.

An extension portion (i.e., the third extension portion E3) of the data line 23-1 serves as the second electrode 211b of the first transistor T1, and another extension portion (i.e., the fourth extension portion E4) of the data line 23-1 serves as the second electrode 212b of the second transistor T2. An extension portion (i.e., a fifth extension portion E5) of the second conductive line 222 serves as the first electrode 211a of the first transistor T1, and another extension portion (i.e., a sixth extension portion E6) of the second conductive line 222 serves as the first electrode 212a of the second transistor T2.

The data line 23-1, the second extension portion E2 of the data line 23-1, the second electrode 211b of the first transistor T1 and the second electrode 212b of the second transistor T2 of the electrostatic protection circuit are of a unitary structure.

The second conductive line 222 electrically connected to the electrostatic protection circuit, the first extension portion E1 of the second conductive line, the first electrode 211a of the first transistor T1, and the first electrode 212a of the second transistor T2 are of a one-piece structure.

The array substrate in the present embodiment is mainly different from the array substrate in the previous embodiment in that all of the plurality of conductive lines 23-1, 23-2, 23-3 and 23-4 are data lines, and any two adjacent ones of the data lines are connected through the electrostatic protection circuit.

The electrostatic protection circuit is connected between two data lines 23 adjacent to the electrostatic protection circuit. When a voltage on one of the data lines suddenly increases, the voltage is discharged to the other of the data lines connected to the electrostatic protection circuit through the first transistor T1 or the second transistor T2.

Under different conditions, each of the data lines can serve as the electrostatic protection line of the other data line connected with the data line through the electrostatic protection circuit, therefore achieving a good electrostatic protection effect of the electrostatic protection circuit of the array substrate in the embodiment without the arrangement of special electrostatic protection lines.

The electrostatic protection circuit in the embodiment has advantages such as simple wring, and convenient manufacturing.

Figure 3A:
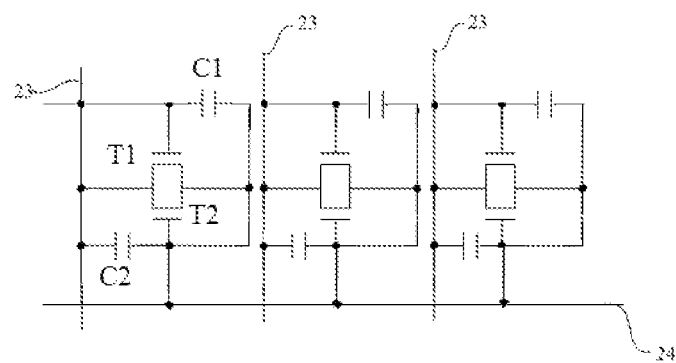
FIG. 3a is a circuit diagram of an array substrate according to an embodiment of the present disclosure.
Figure 3B:
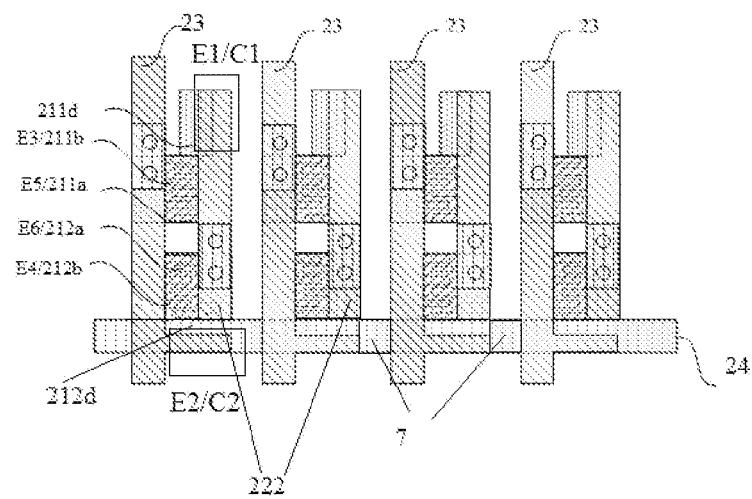

FIG. 3a is a circuit diagram of an array substrate according to an embodiment of the present disclosure; FIG. 3b is a top view of the structure of the array substrate of FIG. 3a. As shown in FIGS. 3a to 3b, the present embodiment provides an array substrate including a plurality of data lines, a discharge line and a plurality of electrostatic protection circuits. At least some of the conductive lines are connected through the electrostatic protection circuit, and the two conductive lines connected to each of the electrostatic protection circuits are a data line 23 and a discharge line 24, respectively.

Each of the electrostatic protection circuits includes a first transistor T1, a second transistor T2, a first capacitor C1, and optionally a second capacitor C2. FIGS. 3a to 3b show the case where the electrostatic protection circuit includes a first capacitor C1 and a second capacitor C2. Of course, the electrostatic protection circuit may include only the first capacitor C1.

A first electrode 211a of the first transistor T1, a first electrode 212a of the second transistor T2, and a gate electrode 212d of the second transistor T2 are electrically connected to the discharge line 24, and a second electrode 211b of the first transistor T1, a second electrode 212b of the second transistor T2, and a gate electrode 211d of the first transistor T1 are electrically connected to the data line 23.

The first capacitor C1 is connected between the gate electrode of the first transistor T1 and the discharge line 24. The second capacitor C2 is connected between the gate electrode of the second transistor T2 and the data line 23.

The array substrate in the present embodiment is mainly different from the array substrate in the previous embodiment in that the plurality of conductive lines include data lines 23 and a discharge line 24, and at least some of the data lines 23 (or each of the data lines 23) is connected to the discharge line 24 through the electrostatic protection circuit. Except for above difference, the array substrate in the present embodiment is substantially the same as the array substrate in the previous embodiment.

As shown in FIG. 3b, each of the electrostatic protection circuits is connected between the data lines 23 and the second conductive line 222 adjacent to each other, and the second conductive line 222 is located between two adjacent data lines 23.

The first extension portion E1 of the second conductive line 222 extends on the gate electrode 211d of the first transistor T1 such that the first extension portion E1 of the second conductive line 222 and a portion of the gate electrode 211d of the first transistor T1 form a first capacitor C1 of the electrostatic protection circuit, with the first extension portion E1 of the second conductive line 222 serving as a first electrode plate of the first capacitor C1, and the portion of the gate electrode 211d of the first transistor T1 serving as a second electrode plate of the first capacitor C1.

The gate electrodes 212d of the plurality of the second transistor T2 and the extension portions 7 of the gate electrodes 212d extend along one line to jointly constitute the discharge line 24.

The gate electrodes 212d of the plurality of the second transistor T2, the extension portions 7 of the gate electrodes 212d, and the discharge line 24 are of or are formed as a unitary structure or a one-piece structure.

A second extension portion E2 of each of the data lines 23 extends on the discharge line 24 such that the second extension portion E2 of the data line 23 and a portion of the discharge line 24 constitute a second capacitor C2 of the electrostatic protection circuit, with the second extension portion E2 of the data line 23 serving as a first electrode plate of the second capacitor C2, and the portion of the discharge line 24 serving as a second electrode plate of the second capacitor C2.

The third extension portion E3 of the data line 23 serves as the second electrode 211b of the first transistor T1, and the fourth extension portion E4 of the data line 23 serves as the second electrode 211b of the second transistor T2. The fifth extension portion E5 of the second conductive line 222 serves as the first electrode 211a of the first transistor T1, and the sixth extension portion E6 of the second conductive line 222 serves as the first electrode 212a of the second transistor T2.

The first electrode 211a of the first transistor T1 and the first electrode 212a of the second transistor T2 of the electrostatic protection circuit, the second conductive line 222, and the first extension portion E1 of the second conductive line 222 are of a one piece structure.

The second electrode 211b of the first transistor T1 and the second electrode 212b of the second transistor T2 of the electrostatic protection circuit, the data line 23, and the second extension portion E2 of the data line 23 are of a one piece structure.

In the present embodiment, the electrostatic protection circuit is connected between the data line 23 and the discharge line 24 to form a connection between the data line 23 and the discharge line 24. When a voltage on any one of the data lines 23 increases instantaneously, the voltage is discharged to the discharge line 24 through the first transistor T1 or the second transistor T2, thereby realizing the electrostatic protection of the electrostatic protection circuit. The specific protection process of the electrostatic protection circuit in the embodiment is similar to that in the previous embodiment, and thus detailed description thereof will not be described herein.

Specifically, the discharge line 24 is a common electrode line and may be grounded.

Figure 4A:
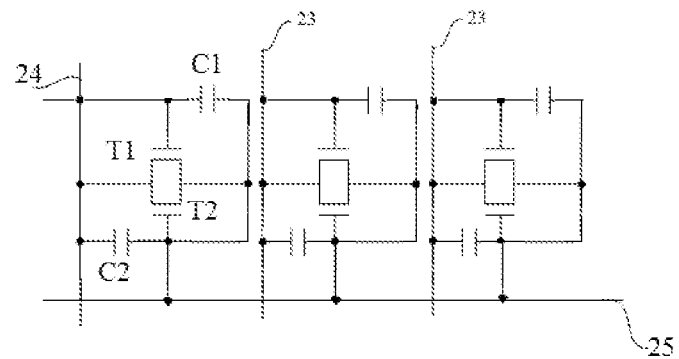
FIG. 4a is a circuit diagram of an array substrate according to an embodiment of the present disclosure.
Figure 4B:
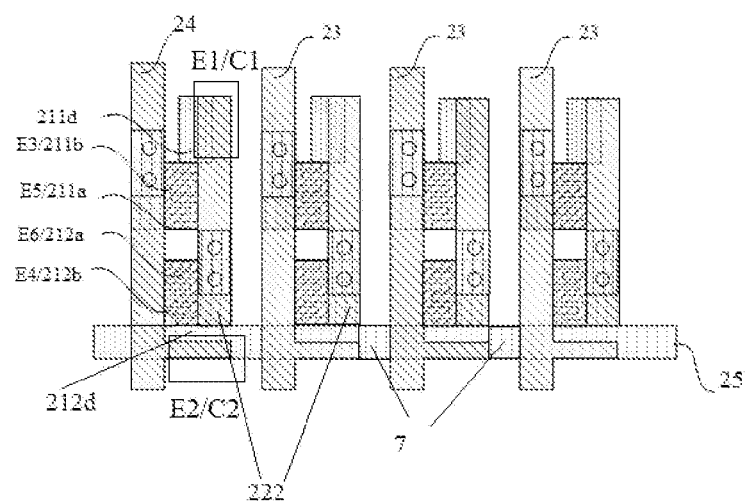

FIG. 4a is a circuit diagram of an array substrate according to an embodiment of the present disclosure; FIG. 4b is a top view of the structure of the array substrate of FIG. 4a. As shown in FIGS. 4a to 4b, the present embodiment provides an array substrate including a plurality of conductive lines and a plurality of electrostatic protection circuits. At least some of the conductive lines are connected through the electrostatic protection circuit. The plurality of conductive lines include a plurality of data lines 23, one discharge line 24, and one short-circuit bar 25.

The plurality of electrostatic protection circuits are arranged in sequence, and the discharge line 24 and the plurality of data lines 23 are arranged in sequence.

A first electrostatic protection circuit is connected between the discharge line 24 and the short-circuit bar 25. Each of the remaining electrostatic protection circuits is connected between one data line 23 and the discharge line 25.

Each of the electrostatic protection circuits includes a first transistor T1, a second transistor T2, and a first capacitor C1 and optionally a second capacitor C2.

For the first electrostatic protection circuit connected between the discharge line 24 and the short-circuit bar 25, a first electrode 211a of the first transistor, a gate electrode 212d of the second transistor T2, and a first electrode 212a of the second transistor T2 are connected to the short-circuit bar 25. A second electrode 211b of the first transistor T1, a second electrode 212b of the second transistor T2, and a gate electrode 211d of the first transistor T1 are connected to the discharge line 24. The first capacitor C1 is connected between the gate electrode 211d of the first transistor T1 and the short-circuit bar 25. The second capacitor C2 is connected between the gate electrode 212d of the second transistor T2 and the discharge line 24.

For each of the remaining electrostatic protection circuits except for the first electrostatic protection circuit, the first electrode 211a of the first transistor T1, the gate electrode 212d of the second transistor T2, and the first electrode 212a of the second transistor are connected to the short-circuit bar 25. The second electrode 211b of the first transistor T1, the second electrode 212b of the second transistor and the gate electrode 211d of the first transistor T1 are connected to the data line 23. The first capacitor C1 is connected between the gate electrode 211d of the first transistor T1 and the short-circuit bar 25. The second capacitor C2 is connected between the gate electrode 212d of the second transistor T2 and the data line 23.

As shown in FIG. 4b, each of the plurality of electrostatic protection circuits is connected between the data line 23 and the second conductive line 222 adjacent to each other, or connected between the discharge line 24 and the second conductive line 222. The second conductive line 222 is located between the discharge line 24 and the data line 23 adjacent to the discharge line 24. Each of remaining second conductive lines 222 is also located between two adjacent data lines 23.

The first extension portion E1 of the second conductive line 222 extends on the gate electrode 211d of the first transistor T1 such that the first extension portion E1 of the second conductive line 222 and a portion of the gate electrode 211d of the first transistor T1 form the first capacitor C1, with the first extension portion E1 of the second conductive line 222 serving as a first electrode plate of the first capacitor C1, and the portion of the gate electrode 211d of the first transistor T1 serving as a second electrode plate of the first capacitor C1.

The gate electrodes 212d of the plurality of second transistors T2 and the extension portions 7 of the gate electrodes extend along one line to jointly constitute the short-circuit bar 25.

The gate electrodes 212d of the plurality of second transistors T2, the extension portions 7 of the gate electrodes, and the short-circuit bar 25 are of or are formed as a unitary structure or one piece structure.

The second extension portion E2 of the discharge line 24 or the second extension portion E2 of each of the data lines 23 extends on the short-circuit bar 25 such that the second extension portion E2 of the discharge line 24 or the second extension portion E2 of each of the data lines 23 and a portion of the short-circuit bar 25 form the second capacitor C2, with the second extension portion E2 of the data line 23 or the second extension portion E2 of the discharge line 24 serving as a first electrode plate of the second capacitor C2, and the portion of the short-circuit bar 25 serving as a second electrode plate of the second capacitor C2.

The third extension portion E3 of the data line 23 or the third extension portion E3 of the discharge line 24 serves as the second electrode 211b of the first transistor T1, the fourth extension portion E4 of the data line 23 or the fourth extension portion E4 of the discharge line 24 serves as the second electrode 212b of the second transistor T2. The fifth extension portion E5 of the second conductive line 222 serves as the first electrode 211a of the first transistor T1, and the sixth extension portion E6 of the second conductive line 222 serves as the first electrode 212a of the second transistor T2.

The first electrode 211a of the first transistor T1 and the first electrode 212a of the second transistor T2 of the electrostatic protection circuit, the second conductive line 222, and the first extension portion E1 of the second conductive line 222 are of a unitary structure.

The second electrode 211b of the first transistor T1 and the second electrode 212b of the second transistor T2 of the electrostatic protection circuit, the data line 23 or the discharge line 24, and the second extension portion E2 of the data line 23 or the second extension portion E2 of the discharge line 24 are of a unitary structure.

The array substrate in the present embodiment is mainly different from the array substrate in the previous embodiment in that the plurality of conductive lines include a plurality of data lines 23, one discharge line 24, and one short-circuit bar 25, with the short-circuit bar 25 being respectively connected to the plurality of data lines 23 through multiple electrostatic protection circuits, and the discharge line 24 being connected to the short-circuit bar 25 through one electrostatic protection circuit. Except for above difference, the array substrate in the present embodiment is substantially the same as the array substrate in the previous embodiments.

Specifically, the plurality of electrostatic protection circuits are arranged in sequence. The first electrostatic protection circuit is connected to the discharge line 24, and the remaining electrostatic protection circuits are connected to the plurality of data lines 23 respectively, and the gate electrodes of all the second transistors T2 are connected to one short-circuit bar 25. The discharge line 24 is a common electrode line. The electrostatic voltage of the discharge line 24 (i.e., the common electrode line) or the electrostatic voltage of the data line 23 may be discharged to the short-circuit bar 25 through the first transistor T1 or the second transistor T2, thereby realizing electrostatic protection. The specific protection process of the electrostatic protection circuit in the embodiment is similar to that in the previous embodiments, and detailed description thereof will not be described herein.

FIGS. 5a to 5d are schematic views showing a method for manufacturing an array substrate.

The array substrate includes a plurality of conductive lines and an electrostatic protection circuit. At least some of the conductive lines are connected through the electrostatic protection circuit. Two conductive lines connected to the electrostatic protection circuit are a first conductive line 221 (e.g., a data line) and a second conductive line 222 (e.g., a data line), respectively. The electrostatic protection circuit includes a first transistor T1, a second transistor T2, and a first capacitor C1 and optionally a second capacitor C2.

Figure 5A:
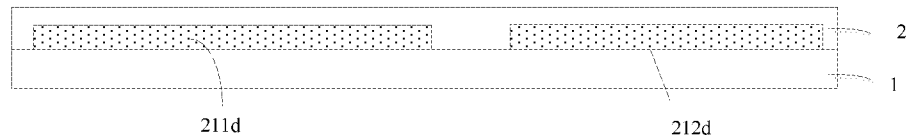
FIGS. 5a to 5d are schematic views of a method for manufacturing an array substrate.

Referring to FIG. 5a, a gate electrode 211d of the first transistor T1 and a gate electrode 212d of the second transistor T2 are formed on a base substrate 1.

One or more low-resistance metal material films are deposited on the base substrate 1 by a physical vapor deposition method such as magnetron sputtering, and the gate electrode 211d of the first transistor and the gate electrode 212d of the second transistor are formed by a photolithography process. The metal film for forming the gate electrodes may be a single-layer metal thin film such as aluminum (Al), copper (Cu), molybdenum (Mo), titanium (Ti), or aluminum/neodymium (Al/Nd), alternatively may be a multi-layer metal thin film such as Mo/Al/Mo or Ti/Al/Ti.

Then, a gate insulating layer 2 is formed on a side of the gate electrode 211d of the first transistor and the gate electrode 212d of the second transistor away from the base substrate 1. The gate insulating layer 2 completely covers the gate electrode 211d of the first transistor and the gate electrode 212d of the second transistor.

Figure 5B:
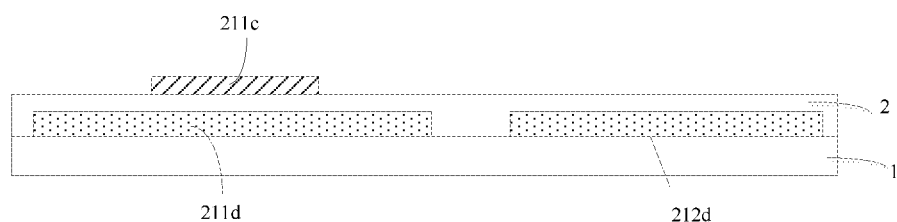

Referring to FIG. 5b, an active layer 211c of the first transistor T1 and an active layer 212c of the second transistor T2 (the active layer 212c of the second transistor T2 is shown in FIG. 1e) are formed on the gate insulating layer. Low-concentration ions are doped into a transistor channel in the polysilicon silicon active layer 4211c or 212c through an ion implantation process to form a conductive channel as required by a thin film transistor in the polycrystalline silicon active layer 4.

Figure 5C:
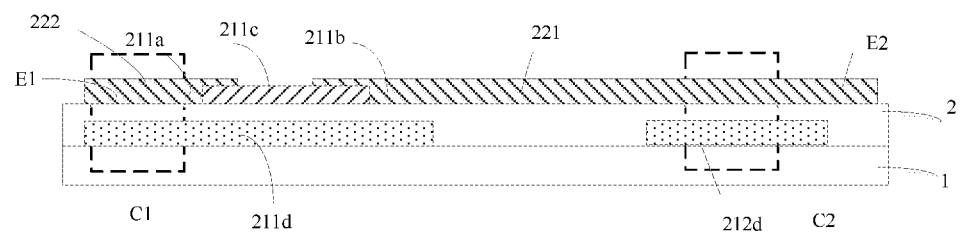

Referring to FIG. 5c, a first electrode 211a and a second electrode 211b of the first transistor T1, a second conductive line 222 formed as a unitary structure with the first electrode 211a, and a first extension portion E1 of the second conductive line 222 are formed on a side of the active layer 211c of the first transistor T1 away from the base substrate 1.

The second conductive line 222 extends on the gate electrode 211d of the first transistor T1 such that the first extension portion E1 of the second conductive line 222 and a portion of the gate electrode 211d of the first transistor T1 form a first capacitor C1, as shown in the block. The first extension portion E1 of the second conductive line 222 serves as a first electrode plate of the first capacitor C1, that is, the first extension portion E1 of the second conductive line 222 and the first electrode plate of the first capacitor C1 are formed as one piece structure. The portion of the gate electrode 211d of the first transistor T1 serves as a second electrode plate of the first capacitor C1, that is, the portion of the gate electrode 211d of the first transistor T1 and the second electrode plate of the first capacitor C1 are formed as one piece structure.

A first electrode 212a and a second electrode 212b of the second transistor T2 (the first electrode 212a and the second electrode 212b of the second transistor T2 is shown in FIG. 1e), a first conductive line 221, and a second extension portion E2 of the first conductive line 221 are formed on a side of the active layer 212c of the second transistor T2 away from the base substrate 1.

The second extension portion E2 of the first conductive line 221 extends on the gate electrode 212d of the second transistor T2 such that the second extension portion E2 of the first conductive line 221 and a portion of the gate electrode 212d of the second transistor T2 form a second capacitor C2, as shown in the block. The second extension portion E2 of the first conductive line 221 serves as a first electrode plate of the second capacitor C2, that is, the second extension portion E2 of the first conductive line 221 and the first electrode plate of the second capacitor C2 are formed as one piece structure. The portion of the gate electrode 212d of the second transistor T2 serves as a second electrode plate of the second capacitor C2, that is, the portion of the gate electrode 212d of the second transistor T2 and the second electrode plate of the second capacitor C2 are formed as one piece structure.

Figure 5D:
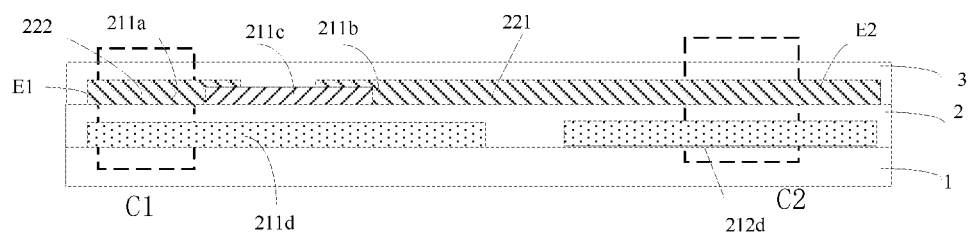

Referring to FIG. 5d, a passivation layer 3 is formed on a side of the first and second electrodes 211a and 211b of the first transistor T1, the first and second electrodes 212a and 212b of the second transistor T2, the first conductive line 221, and the second conductive line 222 away from the base substrate 1.

Finally, a via penetrating through the passivation layer 3 and a via penetrating through the passivation layer 3, the second conductive line 222 and the gate insulating layer 2 are formed. A conductive material such as Indium Tin Oxide (ITO) is filled in the vias to form connection electrodes 4-1 and 4-2, as shown in FIG. 1e.

As shown in FIG. 1e, the second electrode 211b of the first transistor T1 of the electrostatic protection circuit is electrically connected to the gate electrode 211d of the first transistor T1 through the connection electrode 4-1.

As shown in FIG. 1e, the second conductive line 222 is connected to the gate electrode 212d of the second transistor T2 of the electrostatic protection circuit through the connection electrode 4-2.

An embodiment also provides a display device including the above array substrate or including the array substrate manufactured according to the above method. The display device may be any product or component with a display function, such as a liquid crystal display panel, an organic light emitting diode (OLED) display panel, an electronic paper, a mobile phone, a tablet computer, a television, a display, a notebook computer, a digital photo frame, a navigator and the like.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. An array substrate, comprising a plurality of conductive lines and an electrostatic protection circuit on a base substrate, two of the plurality of conductive lines being connected to the electrostatic protection circuit, and the two of the plurality of conductive lines connected to the electrostatic protection circuit being a first conductive line and a second conductive line, respectively, wherein the electrostatic protection circuit comprises a first transistor, a second transistor, and a first capacitor, a first electrode of the first transistor, a first electrode of the second transistor and a gate electrode of the second transistor are connected to the second conductive line, and a second electrode of the first transistor, a second electrode of the second transistor and a gate electrode of the first transistor are connected to the first conductive line, and one terminal of the first capacitor is connected to the gate electrode of the first transistor and the other terminal of the first capacitor is connected to the second conductive line, the first electrode of the first transistor is an interdigital electrode comprising a plurality of first fingers directly contact with the second conductive line, the second electrode of the first transistor is an interdigital electrode comprising a plurality of second fingers directly contact with the first conductive line, and an orthographic projection of the gate electrode of the first transistor on the base substrate overlaps both of orthographic projections of the plurality of first fingers on the base substrate and orthographic projections of the plurality of second fingers on the base substrate, the first electrode of the second transistor is an interdigital electrode comprising a plurality of third fingers directly contact with the second conductive line, the second electrode of the second transistor is an interdigital electrode comprising a plurality of fourth fingers directly contact with the first conductive line, and an orthographic projection of the gate electrode of the second transistor on the base substrate overlaps both of orthographic projections of the plurality of third fingers on the base substrate and orthographic projections of the plurality of fourth fingers on the base substrate.

2. The array substrate according to claim 1, wherein the electrostatic protection circuit further comprises a second capacitor connected between the gate electrode of the second transistor and the first conductive line.

3. The array substrate according to claim 2, wherein the gate electrode of the second transistor is on the side of the base substrate,
the gate insulating layer is on a side of the gate electrode of the second transistor away from the base substrate, and
a second extension portion of the first conductive line is on the side of the gate insulating layer away from the base substrate such that the second extension portion of the first conductive line and a portion of the gate electrode of the second transistor constitute the second capacitor, the second extension portion of the first conductive line serving as a first electrode plate of the second capacitor, and the portion of the gate electrode of the second transistor serving as a second electrode plate of the second capacitor.

4. The array substrate according to claim 3, wherein
a third extension portion of the first conductive line serves as a second electrode of the first transistor,
a fourth extension portion of the first conductive line serves as the second electrode of the second transistor,
a fifth extension portion of the second conductive line serves as the first electrode of the first transistor, and
a sixth extension portion of the second conductive line serves as the first electrode of the second transistor.

5. The array substrate according to claim 4, wherein
the plurality of first fingers are spaced apart from each other and electrically connected together at one ends,
the plurality of second fingers are spaced apart from each other and electrically connected together at one ends,
each of the first fingers is between two adjacent second fingers of the plurality of second fingers, and
each of the second fingers is between two adjacent first fingers of the plurality of first fingers.

6. The array substrate according to claim 5, wherein
the plurality of third fingers are spaced apart from each other and electrically connected together at one ends,
the plurality of fourth fingers are spaced apart from each other and electrically connected together at one ends,
each of the third fingers is between two adjacent fourth fingers of the plurality of fourth fingers, and
each of the fourth fingers is between two adjacent third fingers of the plurality of third fingers.

7. The array substrate according to claim 6, comprising a plurality of electrostatic protection circuits,
wherein the first conductive line electrically connected to each of the plurality of the electrostatic protection circuits is a first data line,
the second conductive line electrically connected to each of the plurality of electrostatic protection circuits is a branch of a second data line, the second data line being immediately adjacent to the first data line, and
each of the plurality of electrostatic protection circuits is connected between any two adjacent data lines.

8. The array substrate according to claim 7, wherein
two electrostatic protection circuits adjacent to any one data line are symmetrically arranged on both sides of the data line with the data line as a symmetry axis, and two second conductive lines branched from any one data line are symmetrically arranged on both sides of the data line with the data line as a symmetry axis.

9. The array substrate according to claim 6, comprising a plurality of electrostatic protection circuits,
wherein the plurality of conductive lines further comprises a discharge line,
the first conductive line electrically connected to each of the plurality of electrostatic protection circuits is a data line, and
each data line is connected to the discharge line through the electrostatic protection circuit.

10. The array substrate according to claim 9, wherein
the second conductive line is between two adjacent data lines,
gate electrodes of the second transistors of the plurality of electrostatic protection circuits and extension portions of the gate electrodes extend along one line to jointly constitute the discharge line, and
the second extension portion of each data line extends on the discharge line such that the second extension portion of each data line and a portion of the discharge line constitute the second capacitor of the electrostatic protection circuit, the second extension portion of each data line serving as a first electrode plate of the second capacitor, and the portion of the discharge line serving as a second electrode plate of the second capacitor.

11. The array substrate according to claim 6, comprising a plurality of electrostatic protection circuits,
wherein the plurality of conductive lines further comprises a short-circuit bar,
the first conductive line electrically connected to each of the plurality of electrostatic protection circuits is a data line or a discharge line, and
each data line and the discharge line are respectively connected to the short-circuit bar through the electrostatic protection circuit.

12. The array substrate according to claim 11, wherein
one of a plurality of second conductive lines is between the discharge line and a data line adjacent to the discharge line,
each of remaining second conductive lines of the plurality of second conductive lines is between any two adjacent data lines,
gate electrodes of the second transistors of the plurality of electrostatic protection circuits and extension portions of the gate electrodes extend along one line to jointly constitute the short-circuit bar, and
the second extension portion of the data line or discharge line extends on the short-circuit bar such that the second extension portion of the data line or discharge line and a portion of the short-circuit bar form the second capacitor, the second extension portion of the data line or discharge line serving as a first electrode plate of the second capacitor, and the portion of the short-circuit bar serving as a second electrode plate of the second capacitor.

13. The array substrate according to claim 9, wherein the discharge line is a common electrode line.

14. A display device, comprising the array substrate according to claim 1.

15. The array substrate according to claim 1, wherein
the array substrate further comprises a gate insulating layer,
wherein the gate electrode of the first transistor is on a side of the base substrate, an active layer of the first transistor is on a side of the gate insulating layer away from the base substrate, and a first extension portion of the second conductive line is on a side of the active layer of the first transistor away from the base substrate such that the first extension portion of the second conductive line and a portion of the gate electrode of the first transistor constitute the first capacitor, the first extension portion of the second conductive line serving as a first electrode plate of the first capacitor, and the portion of the gate electrode of the first transistor serving as a second electrode plate of the first capacitor, the first capacitor has a vertical structure perpendicular to the base substrate and comprising:

the portion of the gate electrode of the first transistor, the gate insulating layer on a side of the gate electrode of the first transistor away from the base substrate, and the first extension portion of the second conductive line on a side of the gate insulating layer away from the portion of the gate electrode of the first transistor, wherein an orthographic projection of the first extension portion of the second conductive line on the base substrate overlaps an orthographic projection of the portion of the gate electrode of the first transistor on the base substrate.

* * * * *